United States Patent [19]
Benz et al.
[11] Patent Number: 4,943,785
[45] Date of Patent: Jul. 24, 1990

[54] CONTROLLABLE AC VOLTAGE AMPLIFIER

[75] Inventors: Paul Benz, Stuttgart; Günther Lippold, Ostfildern, both of Fed. Rep. of Germany

[73] Assignee: Alcatel N.V., Amsterdam, Netherlands

[21] Appl. No.: 340,336

[22] Filed: Apr. 19, 1989

[30] Foreign Application Priority Data

Apr. 26, 1988 [DE] Fed. Rep. of Germany ....... 3814041

[51] Int. Cl.[5] .......................... H03G 3/30; H03F 3/14
[52] U.S. Cl. ..................................... 330/277; 330/285
[58] Field of Search ................................ 330/277, 285

[56] References Cited

U.S. PATENT DOCUMENTS

| | | | |
|---|---|---|---|
| 3,388,338 | 6/1968 | Austin | 330/285 X |
| 3,462,701 | 8/1969 | Miller | 330/277 |
| 4,229,707 | 10/1980 | Suganuma | 330/285 X |
| 4,420,724 | 12/1983 | Owen | 330/277 |
| 4,500,848 | 2/1985 | Marchand et al. | 330/285 |
| 4,510,460 | 4/1985 | Tamura | 330/285 |
| 4,578,603 | 3/1986 | McPherson | 330/277 X |
| 4,591,802 | 5/1986 | Asazawa | 330/277 |

FOREIGN PATENT DOCUMENTS

| | | | |
|---|---|---|---|
| 3204839 | 4/1984 | Fed. Rep. of Germany . | |
| 112010 | 8/1980 | Japan | 330/277 |

OTHER PUBLICATIONS

L. Büttner; Verstärkereingangsstufen Mit Feldeffekhransistoren, In: Funk-Technik, NR 23, 1966, S. 832.
Tietze/Schenk; Halbleiter Schaltungstechnik, 5. Auflage, Berlin, Heidelberg, New York, Springer Verlag, 1980, S. 91, 92, 232, 233.

*Primary Examiner*—James B. Mullins
*Attorney, Agent, or Firm*—Spencer & Frank

[57] ABSTRACT

A broadband amplifier having controllable amplification and an extremely high upper frequency limit includes a single-gate field-effect transistor arranged in a common-source configuration and a variable voltage source connected to the source terminal of the single-gate field-effect transistor. The gate terminal of the single-gate field-effect transistor is connected to RF input signals to be amplified. The drain current $I_D$ is varied by a controllable voltage; this voltage changes the gain but does not change the low resistance during the controlled process. The transconductance S of the single-gate field-effect transistor is portional to the square root of the drain current $I_D$. Thus, two or more single-gate field-effect transistors can be connected in series to form a multiple-stage amplifier without interfering with one another.

11 Claims, 5 Drawing Sheets

A
C2
C4
RD
F4
R2
R4
C3
R3
R5
R1
F3
F2
F1
CA
C1
CB
Z1
U0
USt
UE
-U

CONTROLLABLE AC VOLTAGE AMPLIFIER

BACKGROUND OF THE INVENTION

The present invention relates to an AC voltage amplifier, particularly a broadband amplifier for optical communication, comprising a single-gate field-effect transistor to which the input voltage to be amplified is applied at the gate end.

There are prior-art AC voltage amplifiers containing a dual-gate filed-effect transistor which operates in a frequency range of a few hertz to several gigahertz.

A dual-gate field-effect transistor can be thought of as a cascade circuit represented by two single-gate transistors, with the input transistor used in a common-source configuration and the output transistor operating as a gate stage in the turn-on region. Because of its complicated geometrical structure, a dual-gate field-effect transistor has a lower cutoff frequency than a single-gate field-effect transistor used as part of a dual-gate field-effect transistor, and it has a higher input capacitance than such a single-gate field-effect transistor. In a dual-gate field-effect transistor, small currents may occur in the control process which also flow in the gate stage. As a result, the cutoff frequency is reduced.

This AC voltage amplifier does not permit a very large bandwidth and a wide dynamic range.

SUMMARY OF THE INVENTION

It is an object of the invention to provide an AC voltage amplifier which is controllable and does not have the disadvantages of an AC voltage amplifier with a dual-gate field-effect transistor.

It is another object of the invention to provide a controllable multiple-stage amplifier.

The first-mentioned object is attained by applying that a first voltage derived by a resistance-capacitance combination to the single-gate field-effect transistor at the gate end and a second voltage at the drain end, where the second voltage is opposite in sign to the first voltage, and the gain of the single-gate field-effect transistor is controllable through the second voltage.

It is advantageous that for the single-gate field-effect transistor, any field-effect transistor with a high transition frequency can be used, e.g. a high-electron-mobility transistor (HEMT).

They have the advantage that the load resistance connected to this AC voltage amplifier is nearly independent of frequency. While in a cascade circuit as is represented by the dual-gate field-effect transistor, the cutoff frequency changes twice as a function of the voltage, according to the invention only a single transistor of higher cutoff frequency is controlled.

The second-mentioned object is attained by constructing the multiple-stage amplifier from two or more AC voltage amplifiers according to the instant invention, each amplifier comprising a single-gate field-effect transistor and forming one stage.

In a further embodiment, the single-gate field-effect transistors of the individual stages operate at a nearly constant drain-source voltage. They are driven by transistors acting as current sources with a variable drain current in the pinch-off region of the drain-source voltage; the drain current depends only on the voltage with which the transistors are driven.

BRIEF DESCRIPTION OF THE DRAWINGS

The invention will now be explained by way of example with reference to the accompanying drawings, in which.

DETAILED DESCRIPTION OF THE PREFERRED EMBODIMENTS

Figure 1:
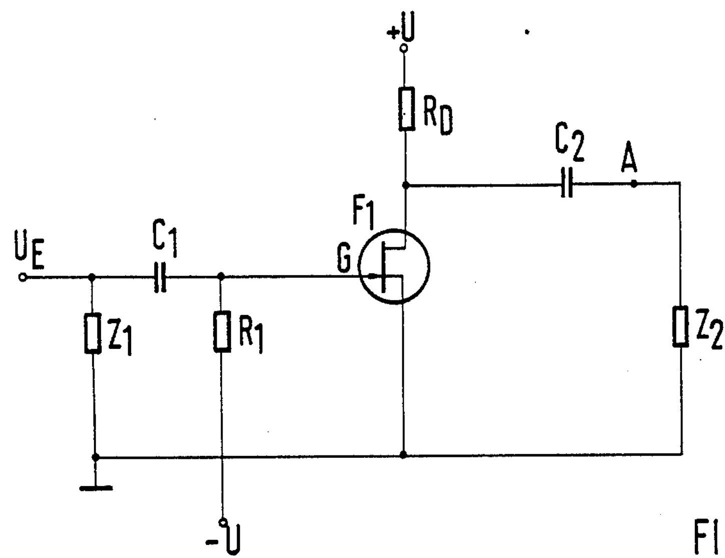
FIG. 1 shows an amplifier circuit with a single-gate field-effect transistor in a common-source configuration.

The basic circuit diagram shown in FIG. 1 contains a single-gate field-effect transistor $F_1$ used in a common-source configuration. A high-frequency AC voltage $U_E$ is applied to its gate through a capacitor $C_1$, and a negative, constant voltage $-U$ through a resistor $R_1$. A resistor $Z_1$ represents the input resistor of the circuit and is coupled to the gate of the transistor $F_1$ through the capacitor $C_1$. A resistor $Z_2$ forms an output load resistor and is connected to the drain terminal of the transistor $F_1$ through a capacitor $C_2$. A positive, variable voltage $+U$ is applied to the drain of the transistor $F_1$ through a decoupling resistor $R_D$. At higher frequencies, the resistor $R_D$ may be replaced by a wideband coil; it also serves to set the gain.

The fact that the voltages $+U$ and $-U$ are positive and negative, respectively, applies only in the case of an n-channel single-gate field-effect transistor $F_1$; in the case of a p-channel transistor, they must have opposite polarities.

Because of the capacitor $C_2$, the output voltage $U_A$ contains no DC component, either.

Figure 2:
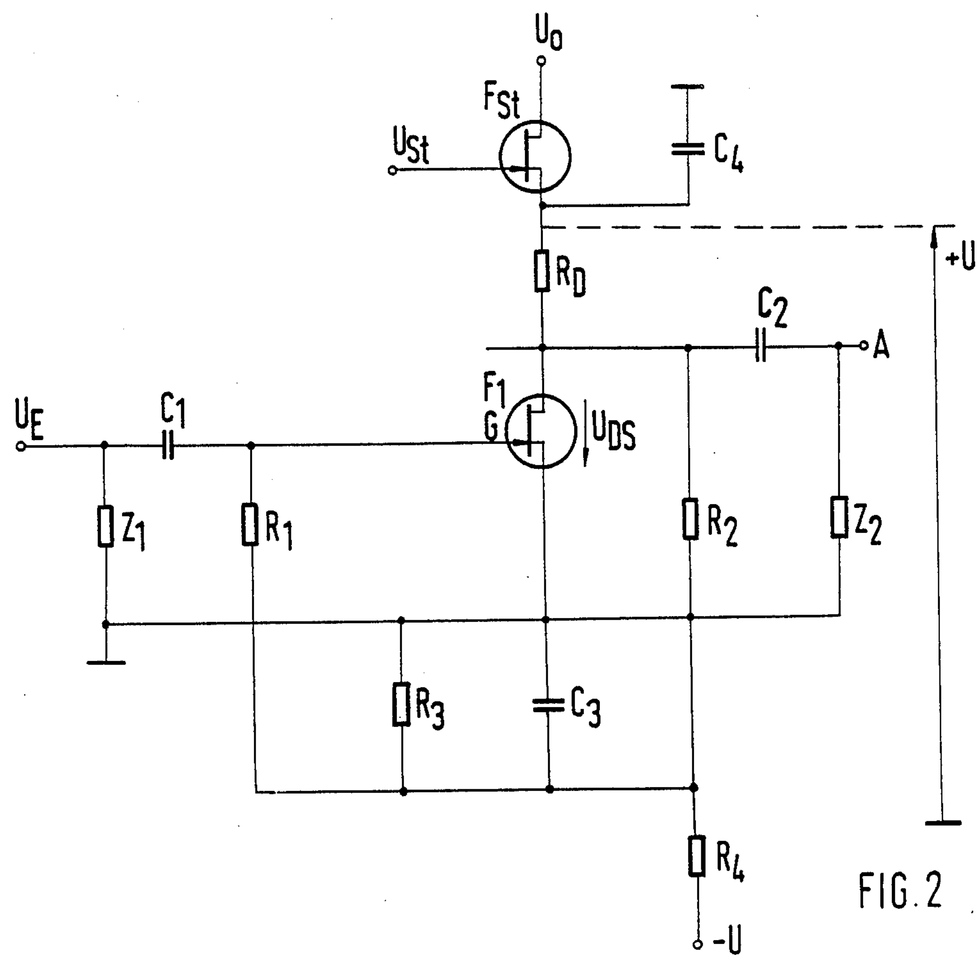
FIG. 2 shows an embodiment of the amplifier according to the invention in a single stage containing the single-gate field-effect transistor of FIG. 1 and an additional field-effect transistor for providing voltage drive.

FIG. 2 shows an amplifier stage which, in addition to the resistors $R_1$, $R_D$, $Z_1$, $Z_2$ and the capacitors $C_1$, $C_2$, contains a capacitor $C_3$ and resistors $R_2$, $R_3$, $R_4$, with which the stage is voltage-stabilized. In this manner, part of the drain-source voltage $U_{DS}$, together with the voltage $-U$, here a supply voltage, is fed into the gate of the single-gate field-effect transistor and an optimum gate voltage is set at the transistor. A capacitor $C_4$ between the resistor $R_D$ and the source terminal of an additional field-effect transistor $F_{St}$ is grounded, so that only a DC voltage is applied at the source terminal.

In this case, the positive voltage $+U$ is controlled "wattlessly" by the field-effect transistor $F_{St}$, whose drain terminal is connected to a constant voltage $U_o$, while its gate is driven by a drive voltage $U_{St}$.

Figure 6:
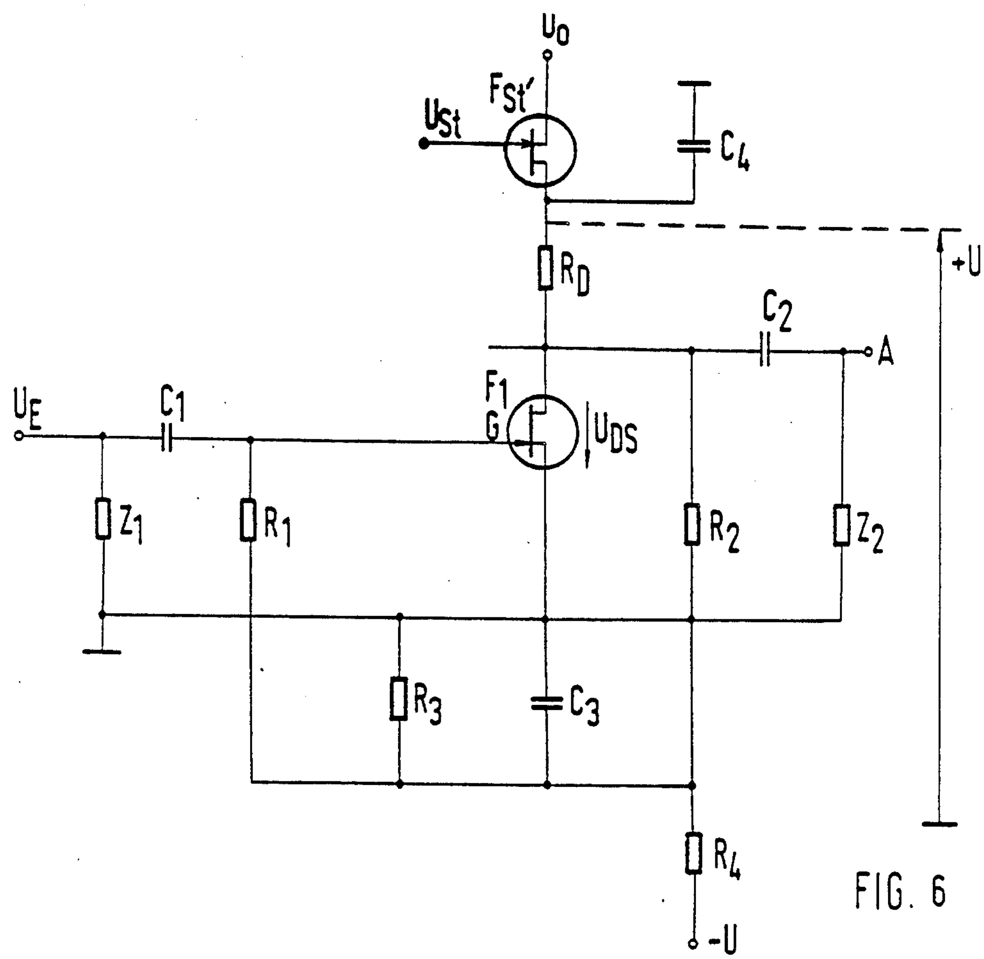
FIG. 6 shows a modified amplifier of FIG. 2 where the additional field-effect transistor operates as a current source.

The field-effect transistor $F_{St}$ acts as a voltage source in this case. FIG. 6 illustrates a broadband amplifier stage where transistor $F_{St'}$ is the polarized reversal of transistor $F_{St}$. Thus, the voltage $U_o$ is applied at the source end rather than the drain end of the transistor and, the field-effect transistor $F_{St'}$ acts as a current source. Instead of a transistor $F_{St}$, any other voltage or current source permitting control of the voltage +U can be used. The voltage $U_{St}$ may be generated in a feedback control loop in which a comparison between the reference value and the actual value of the output voltage $U_A$ is performed.

A change in the voltage +U by means of the field-effect transistor $F_{St}$ has the effect that the drain current $I_D$ of the single-gate field-effect transistor $F_1$ is also varied. The latter then operates in a region of variable transconductance $$S = \left( \frac{\partial I_D}{\partial u_{GS}} \right)_{UDS}$$

and variable gain.

Instead of the voltage drive provided by the field-effect transistor $F_{St}$, current drive can be provided by a current source.

A resistor $R_5$ suppresses high-frequency oscillations.

Figure 3:
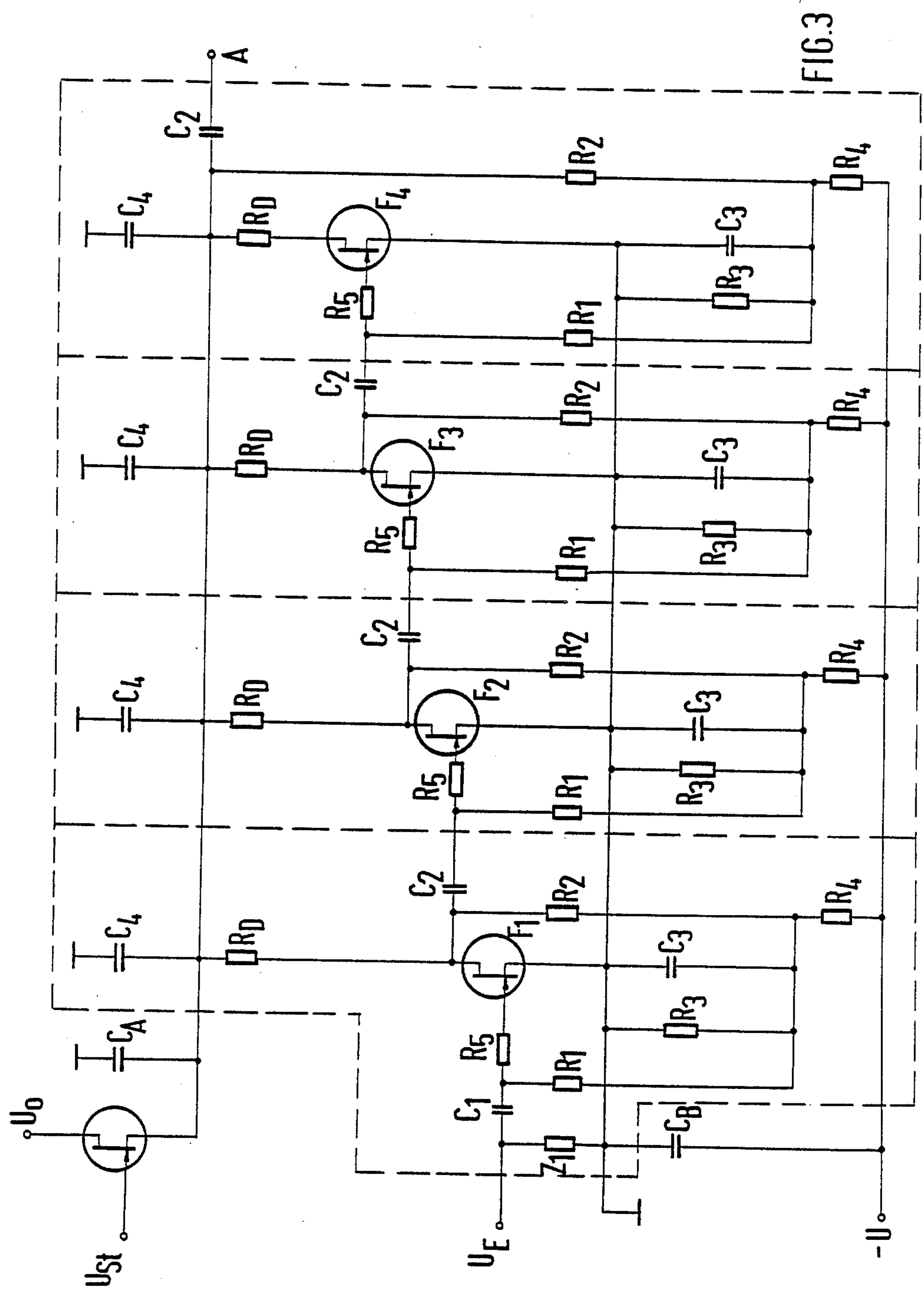
FIG. 3 shows a multiple-stage amplifier consisting of four stages each containing a single-gate field-effect transistor as shown in FIG. 2 and a field-effect transistor for driving the drain of the single-gate field-effect transistor.

A multiple-stage amplifier (FIG. 3) consists of four stages each containing a single-gate field-effect transistor $F_1$, $F_2$, $F_3$, $F_4$ having its drain terminal connected through a resistor $R_D$ to the source terminal of the field-effect transistor $F_{St}$, so that a variable positive voltage +U is applied to all single-gate field-effect transistors $F_1$ through $F_4$. In this manner, the dynamic range of each of the single-gate field-effect transistors $F_1$ through $F_4$ is fully utilized.

All resistors $R_3$, $Z_1$, $Z_2$ have been eliminated except the resistor $Z_1$ in the first stage. The capacitor $C_2$ at the drain of the single-gate field-effect transistor in each stages has merged with the capacitor $C_1$ at the gate of the respective next stage.

Two capacitors $C_A$, $C_B$ at the input end and two capacitors $C_4$, $C_3$ in each stage connect the AC voltage to ground.

Figure 4:
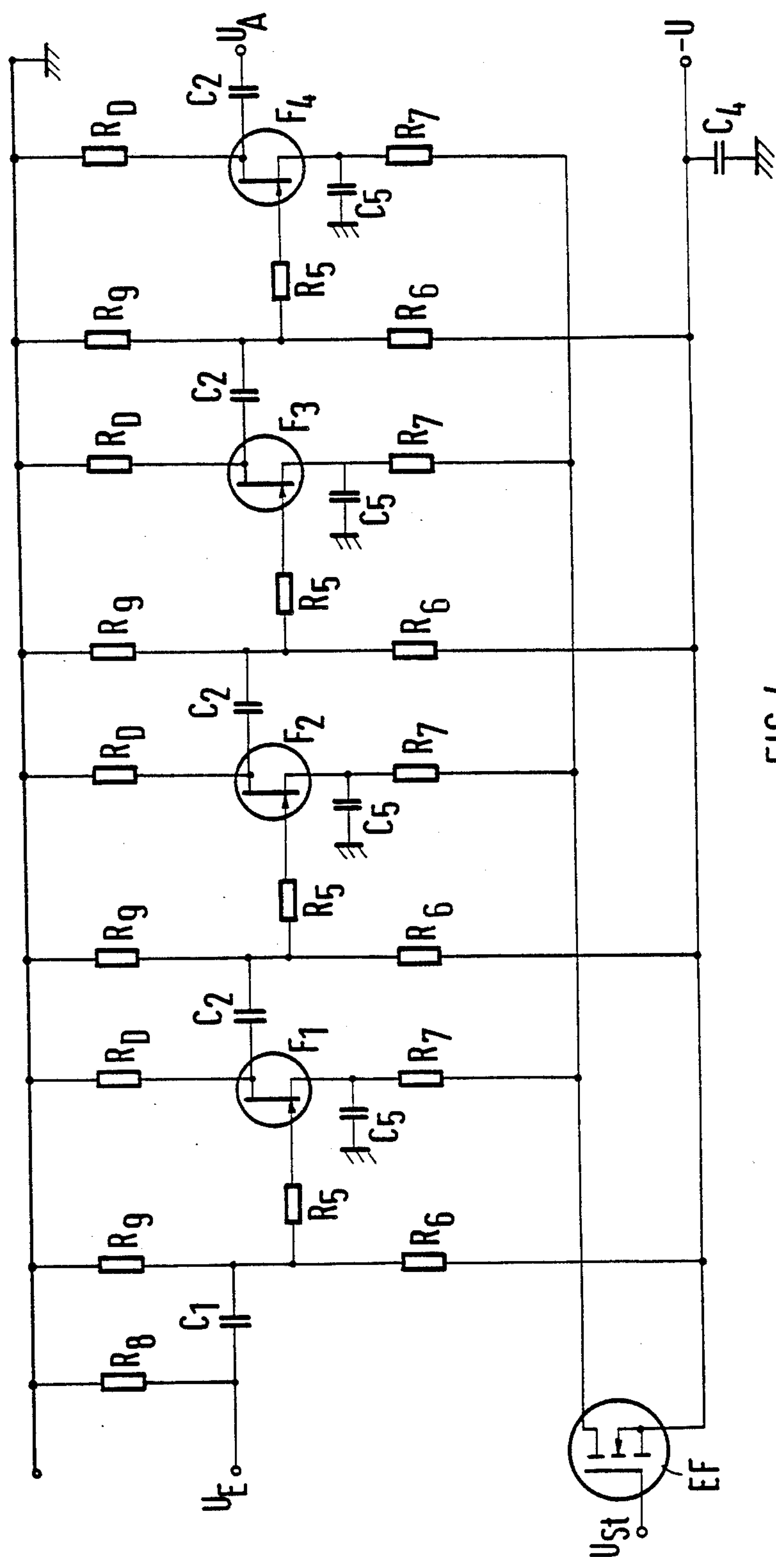
FIG. 4 shows a multiple-stage amplifier consisting of four stages each containing a single-gate field-effect transistor as shown in FIG. 2 and a field-effect transistor for driving the source of the single-gate field-effect transistor.

The single-gate field-effect transistors $F_1$, $F_2$, $F_3$, $F_4$ of another, likewise four-stage amplifier (FIG. 4) are driven at their sources by the drain current of an n-channel enhancement-mode metal-oxide semiconductor field-effect transistor (MOSFET). The latter is driven by a drive voltage $U_{St}$. A capacitor $C_5$ at the source of each of the single-gate field-effect transistors $F_1$ through $F_4$ provides AC voltage isolation.

A supply-voltage source provides a negative, constant supply voltage −U, which is applied to the gate terminal of each of the field-effect transistors $F_1$ to $F_4$ through a resistor $R_6$ and the resistor $R_5$. Each of the drain resistors $R_D$ is connected in parallel with a resistor $R_9$ and grounded.

With the aid of the supply voltage −U and the voltage divider formed by the resistors $R_6$, $R_9$, the negative, constant gate voltage is generated.

A resistor $R_8$ forms the input resistor of the amplifier circuit.

Figure 5:
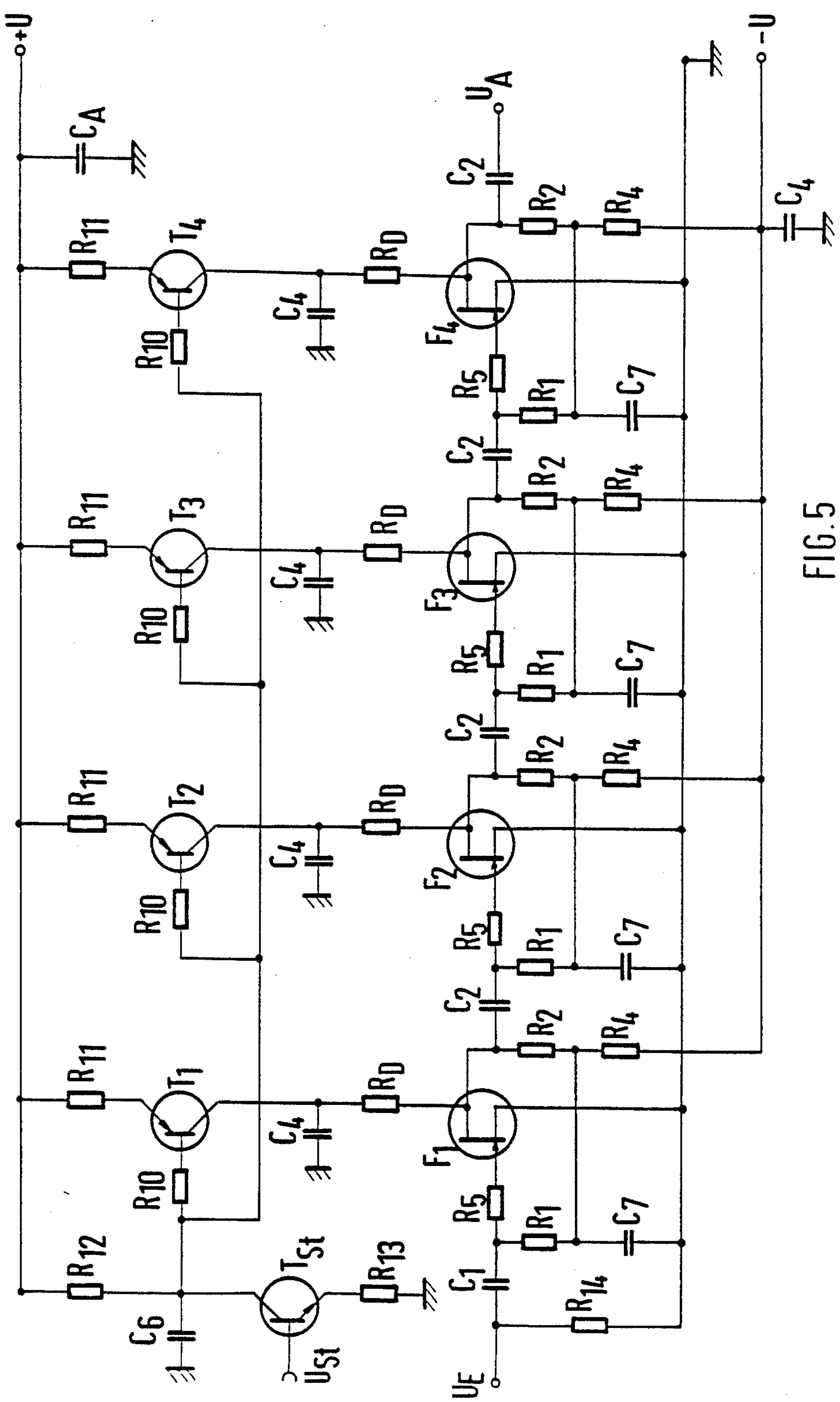
FIG. 5 shows a multiple-stage amplifier consisting of four stages each containing a single-gate field-effect transistor as shown in FIG. 2 and a bipolar transistor as a current source for driving the drain of the single-gate field-effect transistor.

A third four-stage amplifier (FIG. 5) contains pnp bipolar transistors $T_1$ to $T_4$ used in a common-base configuration. Each of them drives the drain of a single-gate field-effect transistor $F_1$ to $F_4$ via the associated resistor $R_D$. The bases of the transistors $T_1$ to $T_4$ are preceded by resistors $R_{10}$; they are grounded through a capacitor $C_6$. The base voltage is provided by the collector of a drive transistor $T_{St}$, whose base is driven by a voltage $U_{St}$ and whose emitter is grounded through a resistor $R_{13}$.

The constant voltage +U is applied to the emitters of the transistors $T_1$ to $T_4$ through emitter resistors $R_{11}$ and to the collector of the drive transistor $T_{St}$ through a collector resistor $R_{12}$. The gate voltage is derived via the resistors $R_1$, $R_2$, $R_4$. The constant, negative voltage −U is grounded through the capacitor $C_4$. The gate of each of the field-effect transistors $F_1$ to $F_4$ is grounded through the resistors $R_1$, $R_5$ and a capacitor $C_7$.

Through the capacitor $C_1$, the AC voltage $U_E$ is coupled into the multiple-stage amplified. A resistor R–represents the input resistor of the multiple-stage amplifier.

In this circuit, the drain-source voltage $U_{DS}$ of the single-gate field-effect transistors $F_1$ to $F_4$ is adjusted so that it lies in the pinch-off region; then, the drain current can be impressed (on the transistors $T_1$ to $T_4$) nearly independently of the drain-source voltage $U_{DS}$.

Instead of the transistors $T_1$ to $T_4$, field-effect transistors or Darlington pairs can be used in the network.

In the four-stage amplifiers shown, a dynamic range of up to 40 dB is possible in the GHz region. Since each stage is driven separately, the overload behavior is favorable.

We claim:

1. A broadband amplifier for amplifying AC voltage, comprising:

a single-gate field-effect transistor, connected in a common source configuration, having a gate terminal, a source terminal and a drain terminal, the input voltage to be amplified being applied to the gate terminal and the source terminal of the single-gate field-effect transistor being directly connected to ground;

first means including a resistance-capacitance combination for connecting a first voltage source to the gate terminal of the single-gate field-effect transistor; and second means for connecting a variable second voltage source, opposite in sign to the first voltage, to the drain terminal of the single-gate field-effect transistor; wherein the gain of the single-gate field-effect transistor is controllable through the variable second voltage.

2. A broadband amplifier as defined in claim 1, wherein said second means includes a second single-gate field-effect transistor, which provides the variable second voltage, the gate terminal of the second transistor being driven wattlessly by a drive voltage, and a constant voltage is applied to the drain terminal of the second transistor.

3. A broadband amplifier as defined in claim 2, wherein the source terminal of the second transistor is grounded via a capacitor.

4. An AC voltage amplifier as defined in claim 1, wherein said second means includes a second field-effect transistor, which provides the variable second voltage, the gate terminal of the second transistor being driven wattlessly by a drive voltage, and a constant voltage is applied to the source terminal of the second transistor.

5. A broadband amplifier as defined in claim 4, wherein the drain terminal of the second transistor is grounded via a capacitor.

6. Multiple-stage amplifier, comprising at least two broadband amplifiers as defined in claim 1 connected in series, each amplifier forming one stage of the multiple-stage amplifier.

7. A multiple-stage amplifier as defined in claim 6, further comprising a second single-gate field-effect transistor which provides the variable second voltage to the single-gate field-effect transistor of each stage.

8. A multiple-stage broadband amplifier comprising:
at least two AC voltage amplifiers connected in series, each AC voltage amplifier forming one stage of the broadband amplifier and comprising a single-gate field-effect transistor having gate, drain and source terminals and being connected in a common source configuration, the gate terminal of the single-gate field-effect transistor of the first AC voltage amplifier in the series being connected to an input voltage to be amplified; and a controllable power field-effect transistor,
wherein a first voltage is derived by a resistance-capacitance combination and is applied to the gate terminal of the single-gate field-effect transistor of each stage, the single-gate field-effect transistor of each stage having its drain terminal grounded through a resistor, and the single-gate field-effect transistor of each stage being controllable at its respective source terminal through the drain current of the controllable power field-effect transistor.

9. Multiple-stage amplifier as defined in claim 8 which consists of two AC voltage amplifiers.

10. A multiple-stage broadband amplifier comprising:
at least two AC voltage amplifiers, each amplifier forming a stage of the broadband amplifier and comprising a single-gate field-effect transistor having gate, source and drain terminals; and at least two bipolar transistors, each connected to a respective single-gate field-effect transistor;
wherein a first voltage is applied to the drain terminal of the single-gate field effect transistor of each stage, a second voltage is applied to the drain terminal of each of the single-gate field-effect transistors in a variable manner via a resistor and one of the at least two bipolar transistors which is connected to the respective stage, and the drain-source voltage of each of the single-gate field-effect transistors is adjustable by means of the first voltage via a plurality resistors.

11. A multiple-stage amplifier as defined in claim 10 which consists of two AC voltage amplifiers.

* * * * *